(12) United States Patent
Lee et al.

(10) Patent No.: US 6,551,859 B1
(45) Date of Patent: Apr. 22, 2003

(54) CHIP SCALE AND LAND GRID ARRAY SEMICONDUCTOR PACKAGES

(75) Inventors: Shaw Wei Lee, Curpertino, CA (US);
Thanh Lequang, San Jose, CA (US);
Wayne W. Lee, San Jose, CA (US);
Glenn Narvaez, Redwood City, CA (US); William Jeffery Schaefer, San Jose, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 38 days.

(21) Appl. No.: 09/791,437

(22) Filed: Feb. 22, 2001

(51) Int. Cl.$^7$ .............................................. H01L 21/48
(52) U.S. Cl. ...................... 438/112; 438/123; 438/124; 438/126; 438/127; 29/827; 29/841; 29/855; 29/856
(58) Field of Search ................................. 438/106, 110, 438/112, 113, 121, 122, 123, 124, 125, 126, 127; 29/827, 841, 855, 856; 257/666, 670, 734, 786

(56) References Cited

U.S. PATENT DOCUMENTS

| | | | | |
|---|---|---|---|---|
| 5,585,195 A | * | 12/1996 | Shimada ..................... | 428/548 |
| 5,656,550 A | * | 8/1997 | Tsuji et al. .................. | 438/123 |
| 5,759,874 A | * | 6/1998 | Okawa ........................ | 438/124 |
| 5,830,800 A | | 11/1998 | Lin ............................. | 438/459 |
| 5,847,458 A | | 12/1998 | Nakamura et al. .......... | 257/738 |
| 5,923,080 A | | 7/1999 | Chun ......................... | 257/666 |
| 5,998,875 A | | 12/1999 | Bodö ......................... | 257/778 |
| 6,034,422 A | * | 3/2000 | Horita et al. ............... | 257/677 |
| 6,130,473 A | | 10/2000 | Mostafazadeh et al. ..... | 257/666 |
| 6,238,952 B1 | * | 5/2001 | Lin ............................. | 438/110 |
| 6,261,864 B1 | * | 7/2001 | Jung et al. .................. | 438/106 |
| 6,306,684 B1 | | 10/2001 | Richardson et al. ........ | 438/118 |
| 6,306,685 B1 | * | 10/2001 | Liu et al. .................... | 438/121 |
| 6,307,755 B1 | | 10/2001 | Williams et al. ............ | 361/813 |
| 6,316,837 B1 | | 11/2001 | Song ........................... | 257/778 |
| 6,333,252 B1 | * | 12/2001 | Jung et al. .................. | 438/612 |
| 6,342,730 B1 | * | 1/2002 | Jung et al. .................. | 257/692 |
| 6,451,627 B1 | * | 9/2002 | Coffman ..................... | 438/111 |

OTHER PUBLICATIONS

U.S. patent application No. 09/528,540, entitled "Leadless Packaging Process Using a Conductive Substrate", filed Mar. 20, 2000, inventor(s): Bayan et al.
U.S. patent application No. 09/590,551, entitled "Lead Frame Design for Chip Scale Package", filed Jun. 2, 2000, inventor(s): Shahram Mostafazadeh.
U.S. patent application No. 09/698,784, entitled "Flip Chip Scale Package", filed Oct. 26, 2000, inventor(s): Shahram Mostafazadeh.

\* cited by examiner

Primary Examiner—Albert W. Paladini
Assistant Examiner—Alonzo Chambliss
(74) Attorney, Agent, or Firm—Beyer Weaver & Thomas LLP

(57) ABSTRACT

Techniques for improving the manufacture and structure of leadframe chip scale packages and land grid array packages are described. One aspect of the invention pertains to a method for patterning a conductive substrate, which is utilized to form a packaged semiconductor device, wherein a metallic barrier layer and a second metallic layer are utilized as an etching resist. A method, according to another aspect of the invention pertains to covering a metallic barrier layer and second metallic layer with a etch resistant cap such that the etch resistant cap is used as a etching resist. In another aspect of the present invention, a method for treating a conductive leadframe with a CZ treatment is disclosed. In yet another aspect of the present invention, techniques relating to locking grooves within the studs of a studded leadframe are disclosed.

15 Claims, 8 Drawing Sheets

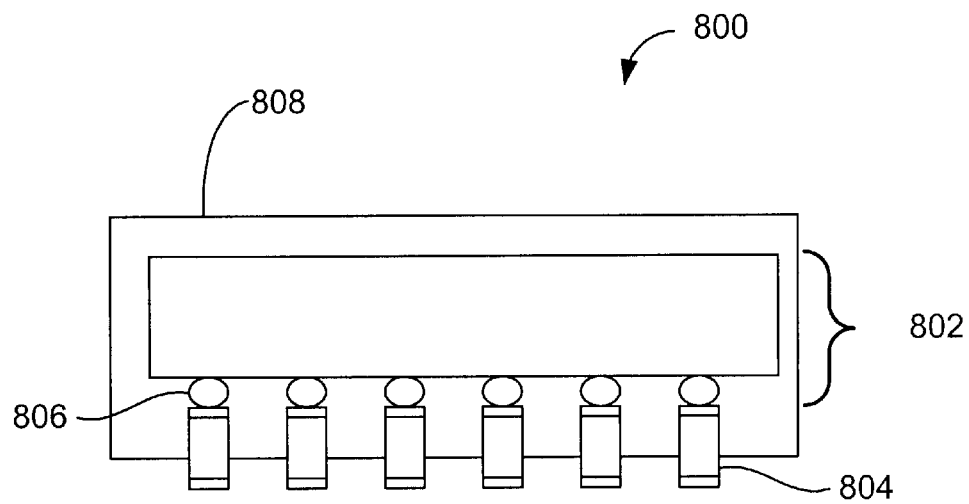
FIG. 8
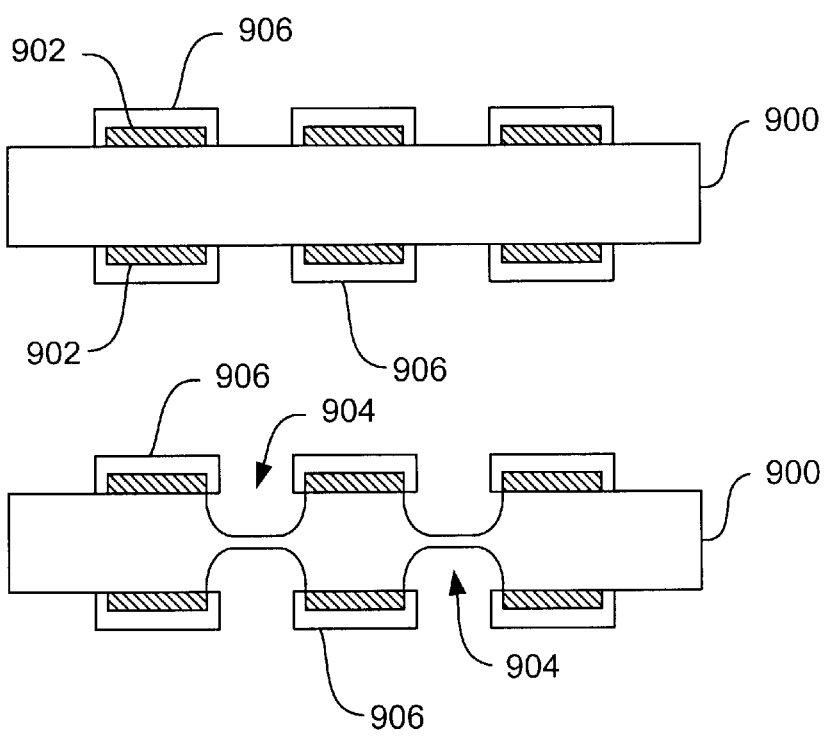
FIG. 9A
FIG. 9B

CHIP SCALE AND LAND GRID ARRAY SEMICONDUCTOR PACKAGES

CROSS-REFERENCE TO RELATED APPLICATION

This application is also related to U.S. patent application Ser. No. 09/590,551, filed on Jun. 9, 2000, entitled "Lead Frame Design for Chip Scale Package," and to U.S. Pat. No. 09/698,736, filed on Oct. 26, 2000, entitled "Flip Chip Scale Package," the content of which is hereby incorporated by reference.

STATEMENT REGARDING FEDERALLY SPONSORED RESEARCH OR DEVELOPMENT

Not Applicable

FIELD OF THE INVENTION

The present invention relates generally to integrated circuit packages and, more specifically, to the use of conductive lead frames for the production of integrated circuit packages.

BACKGROUND OF THE INVENTION

An integrated circuit (IC) package encapsulates an IC chip (die) in a protective casing and may also provide power and signal distribution between the IC chip and an external printed circuit board (PCB). An IC package may use a metal lead frame to provide electrical paths for that distribution.

To facilitate discussion, FIG. 1 is a top view of a lead frame panel 100 made up for a plurality of lead frames that may be used in the prior art. The lead frame may comprise leads 108, die attach pads 112, ties 116 for supporting the die attach pads 112, and a skirt 120 for supporting the plurality of leads 108 and ties 116. The lead frame panel 100 may be etched or stamped from a thin sheet of metal. IC chips 124 may be mounted to the die attach pads 112 by an adhesive epoxy. Wire bonds 128, typically of fine gold wire, may then be added to electrically connect the IC chips 124 to the leads 108. Each IC chip 124 may then be encapsulated with part of the leads 108 and the die attach pad 112 in a protective casing, which may be produced by installing a preformed plastic or ceramic housing around each IC chip or by dispensing and molding a layer of encapsulation material over all IC chips 124. FIG. 2 is a cross-sectional view of part of the lead frame panel 100 and IC chips 124. In a process described in U.S. patent application Ser. No. 09/054,422, entitled "Lead Frame Chip Scale Package", by Shahram Mostafazadeh et al., filed Apr. 2, 1998, a tape 136 is placed across the bottom of the lead frame panel 100 and a dam 132 is placed around the lead frame panel 100. An encapsulation material 140 is poured to fill the dam 132, encapsulating the IC chips 124, the wire bonds 128, and part of the lead frame panel 100. The tape 136 prevents the encapsulation material 140 from passing through the lead frame panel 100. Once the encapsulation material 140 is hardened, the dam 132 and tape 136 may be removed. The encapsulation material 140 may be cut to singulate the IC chips 124 and leads 108.

Even though IC packages can currently be manufactured with metal lead frames that provide for the required electrical pathways, there are continuing efforts to improve IC manufacturing techniques. Therefore, it is desirable to provide IC manufacturing techniques, which utilize metal lead frames, that are more efficient and cost-effective, and that produce IC packages having increased structurally integrity.

SUMMARY

The present invention pertains to improved techniques for forming leadframe chip scale packages and land grid array packages. One aspect of the invention pertains to a method for patterning a conductive substrate, which is utilized to form a packaged semiconductor device, wherein a metallic barrier layer and a second metallic layer are utilized as an etching resist. A method, according to another aspect of the invention pertains to covering a metallic barrier layer and second metallic layer with a etch resistant cap such that the etch resistant cap is used as a etching resist.

In another aspect of the present invention, a method for treating a conductive leadframe with a CZ treatment is disclosed. The CZ treatment provides the conductive leadframe with an improved surface finish that is more adhesive for bonding with molding materials.

In yet another aspect of the present invention, techniques relating to locking grooves within the studs of a studded leadframe are disclosed. The locking grooves allow the studs to form stronger bonds with molding materials used in semiconductor packaging.

These and other features and advantages of the present invention will be presented in more detail in the following specification of the invention and the accompanying figures, which illustrate by way of example the principles of the invention.

BRIEF DESCRIPTION OF THE DRAWINGS

The invention, together with further advantages thereof, may best be understood by reference to the following description taken in conjunction with the accompanying drawings in which:

FIG. 8 illustrates a side plan view of semiconductor device incorporating a flip chip semiconductor device according to one embodiment of the present invention.

FIGS. 9A and 9B illustrate side plan views of a conductive leadframe in order to describe a technique for preventing metal plates from hanging over the edge of etched regions in a leadframe.

DETAILED DESCRIPTION OF THE INVENTION

The present invention will now be described in detail with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps have not been described in detail so not to unnecessarily obscure the present invention.

The present invention pertains to improved techniques for forming leadframe chip scale packages and land grid array packages. Generally, chip scale packages refers to semiconductor packages having sizes that are approximately that of semiconductor chips. Land grid array packages are semiconductor packages having an array of electrical contact landings. Such landings are electrically conductive elements that can have a variety of shapes such as posts and studs.

Figure 1:
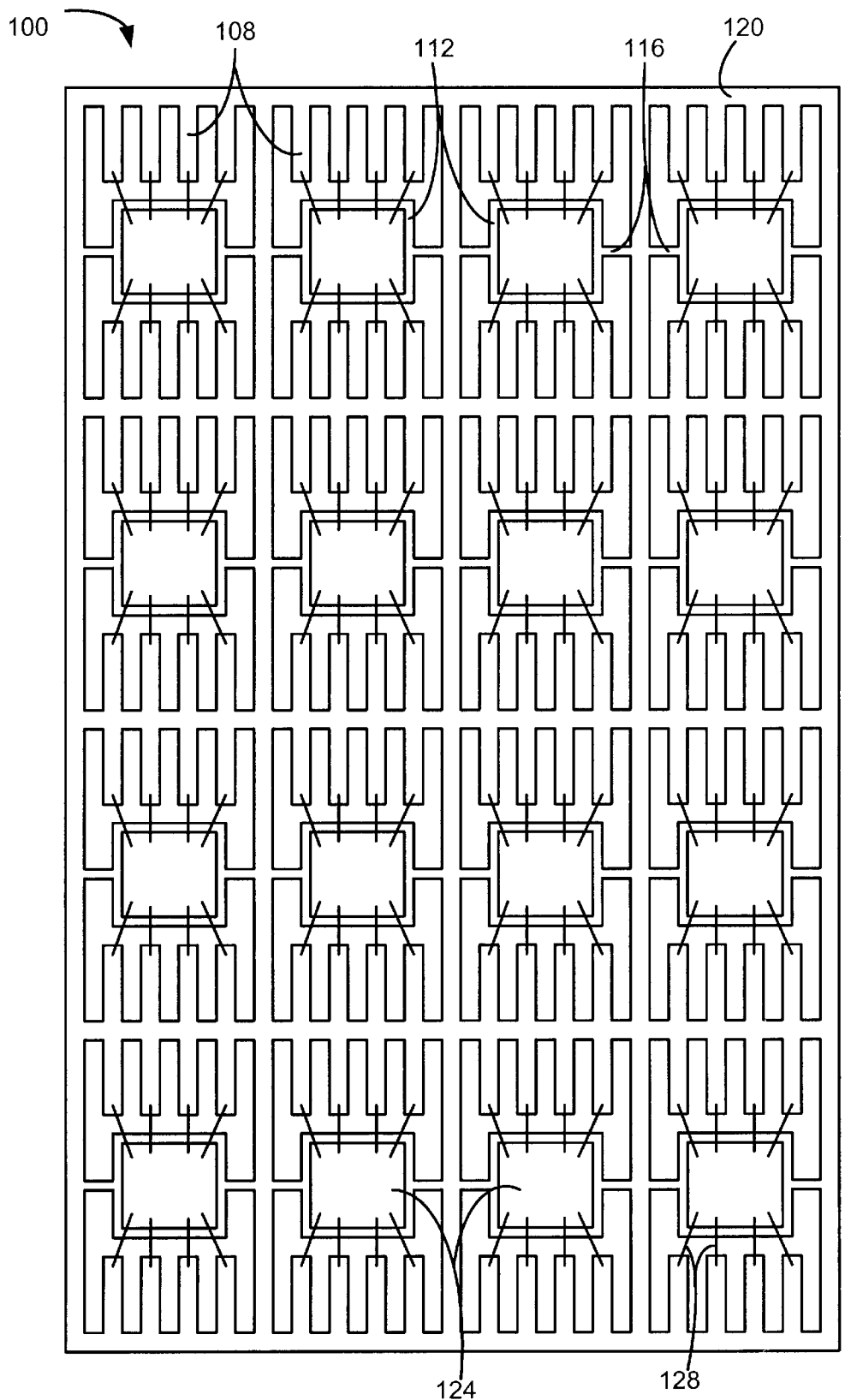
FIG. 1 illustrates a top view of a lead frame panel made up for a plurality of lead frames that may be used in the prior art.
Figure 2:
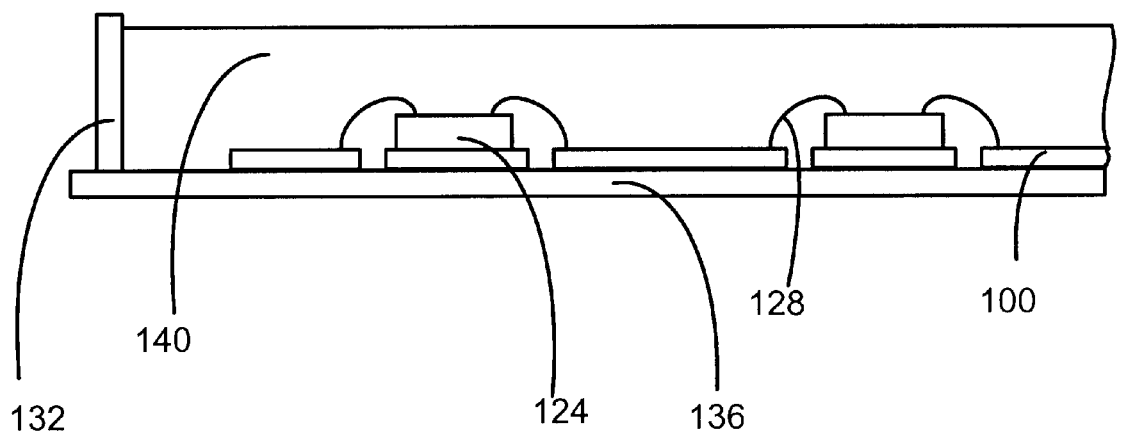
FIG. 2 is a cross-sectional view of part of the lead frame panel and IC chips from FIG. 1.
Figure 3A:
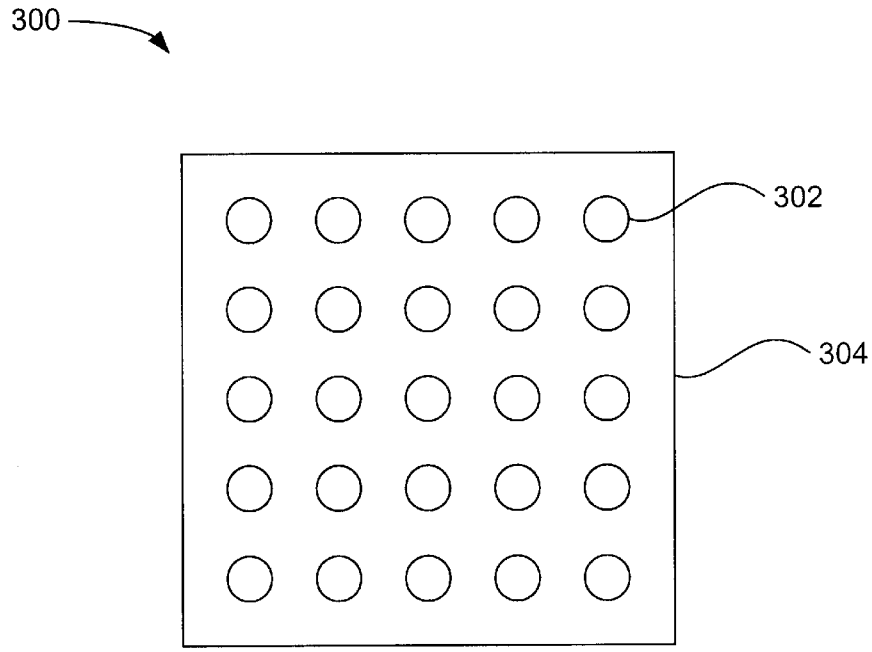
FIGS. 3A and 3B illustrate one embodiment of a semiconductor package that can be manufactured using the techniques according to the present invention.
Figure 3B:
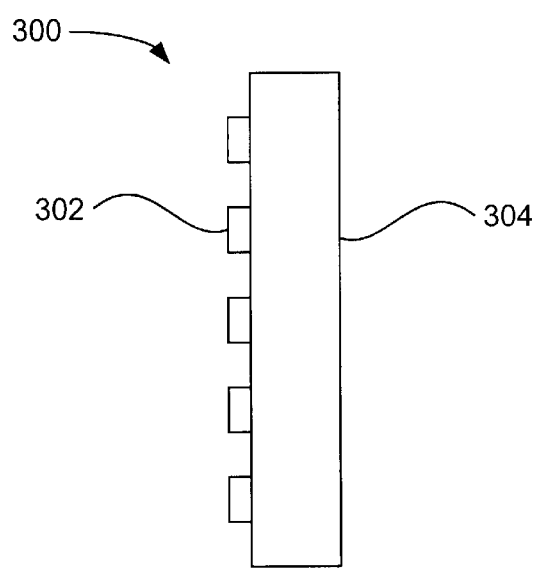

FIGS. 3A and 3B illustrate one embodiment of a semiconductor package 300 that can be manufactured using the techniques described in this patent application. Package 300 includes multiple contact studs 302 that are embedded within a matrix array panel molding (MAP) or molding panel 304. Contact studs 302 are electrically conductive, rod-shaped elements that serve to connect the semiconductor die embedded within the molding panel 304 with other electronic systems (not shown). Molding panel 304 is commonly a material that may be flood molded and then cured, for example, a plastic or epoxy.

Figure 4A:
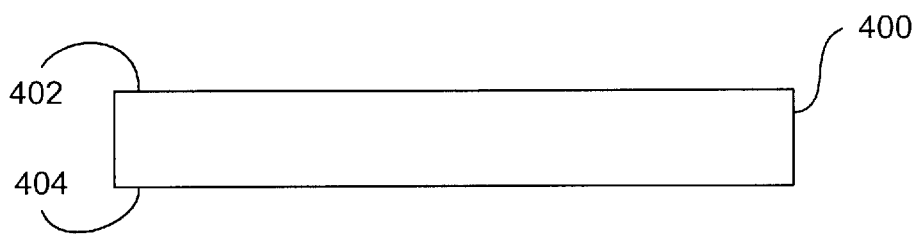
FIGS. 4A–4E illustrate side plan views of a portion of a conductive leadframe as it progresses through photolithography and chemical etching operations to produce a studded leadframe according to one embodiment of the present invention.

FIGS. 4A–4E, and 5–7 will now be described to explain the inventive techniques for manufacturing semiconductor packages. The inventive techniques, for example, may be used to manufacture package 300 shown in FIG. 3A and 3B. FIGS. 4A–4E illustrate side plan views of a portion of a conductive leadframe 400 as it progresses through photolithography and chemical etching operations to produce a studded leadframe that can be used to form semiconductor packages such as package 300. Initially, production of the packaged device begins with a conductive leadframe 400 that has a top surface 402 and a bottom surface 404. A side view of conductive leadframe 400 is illustrated in FIG. 4A. The conductive material of leadframe 400 may be a variety of metals. Commonly, copper is used as the metal for leadframe 400.

Figure 4B:
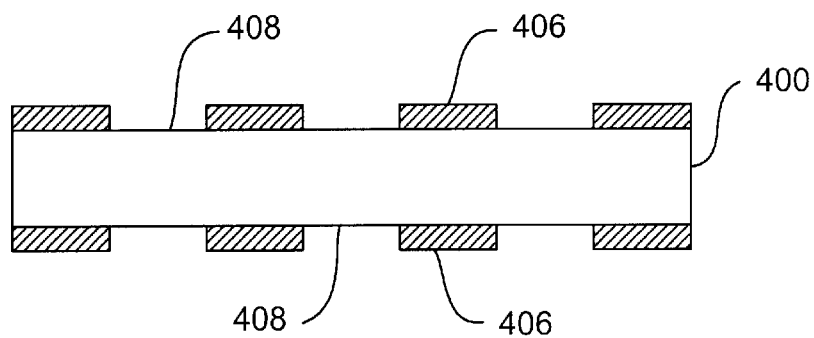

FIG. 4B illustrates the leadframe 400 after dry film photo resist or liquid photo imagable (LPI) material has been applied to both the top surface 402 and the bottom surface 404 of the leadframe 400, selectively exposed to light, developed, and washed. As seen in FIG. 4B, these processes leave only the cured portions of the photo resist 406 on the leadframe 400. From the side plan view of FIG. 4B, cured portions 406 of the photo resist appear to leave substantially equal sized portions 408 of the leadframe 400 exposed. The exposed portions 408 are actually circular in shape when viewed from either the top or bottom plan views of the leadframe 400. As appreciated by those of skill in the art of photolithography, the portion of the photo resist remaining after selective exposure to light depends whether positive or negative photo lithography processes are being used.

Figure 4C:
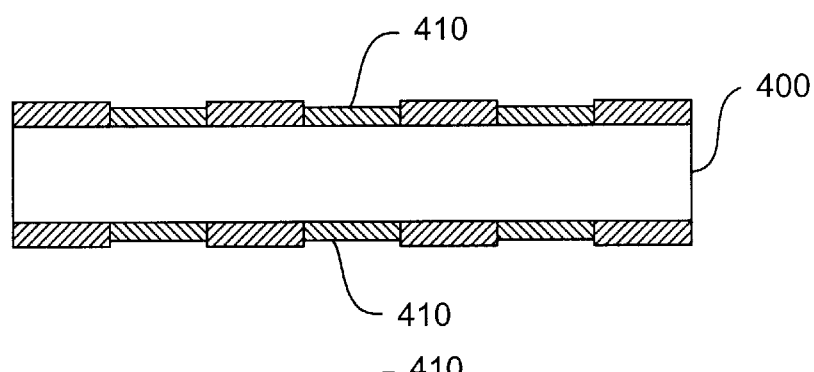

The exposed circular portions 408 of the leadframe 400 are essentially within pockets formed by the cured portions 406 of the photoresist. In the next phase of the manufacturing process, as shown in FIG. 4C, the cured portions 406 of the photo resist are used as a stencil so that metal plates 410 can be formed on the exposed portions 408 of the leadframe 400. The metal plates 410 are formed by applying metal through processes such as electrolytic plating. Preferably, the metal material is nickel gold (NiAu). Commonly, the NiAu material is formed by a layer of Ni that is covered by a layer of Au. The nickel layer can serve as a barrier layer material that separates the conductive leadframe material from the gold layer. It is also common for the Ni layer to be at least about 5 um thick and the Au layer to be about 0.5 um thick. Of course, the thickness of these layers may vary in alternative embodiments of the present invention. Other materials that resist the chemicals used during etching processes may be substituted for Ni and Au.

Figure 4D:
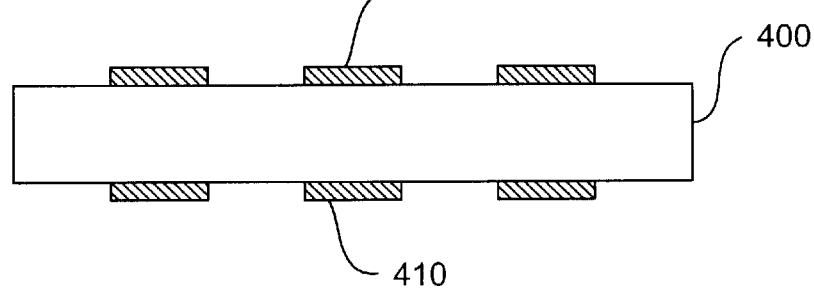

After the metal plates 410 are formed, the cured portions 406 of the photo resist are removed, or stripped, from the top 402 and bottom 404 surfaces of the leadframe 400. FIG. 4D illustrates a side plan view of leadframe 400 after the stripping process, which leaves only the metal plates 410.

The next process operation is that of etching the metal leadframe 400 so to form a leadframe having an array of studs. As mentioned earlier, the studs will be the rod-like elements providing the electrical connections between the packaged semiconductor die and external electronic circuits. According to the present invention, when the metal plates 410 are formed of metal that resist the corroding effects of the substances, such as corrosive chemicals, used to etch the metal leadframe 400. NiAu is a material that does not become corroded under conventional chemical etching processes. The array of metal plates 410 on the top 402 and bottom 404 surfaces can therefore be used as stencils during the chemical etching of the metal leadframe 400.

Figure 4E:
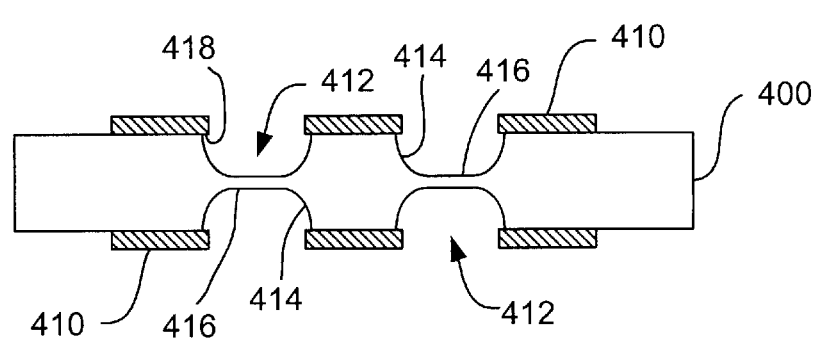

FIG. 4E illustrates a side plan view of leadframe 400 after undergoing a chemical etching process. As can be seen, the etching forms depressed regions 412 between the metal plate 410 in both the top 402 and bottom 404 surfaces of the leadframe 400. The depressed regions 412 actually run along the top and bottom surfaces of the leadframe 400 in a cross-hatching fashion. The cross-hatched depressed regions 412 would be evident when viewing the leadframe 400 in a top or bottom plan view. The cross-hatched depressed regions 412 consequently leave the metal plates 410 being supported by metal studs 414. The studs 414 are interconnected by the remaining stem-like portions 416 of the leadframe 400. The plurality of the stem-like portions 416, as a whole, form a connection sheet that holds the studs 414 in an array formation.

In order to set up a discussion to be presented later in this disclosure, it will now be pointed out that depressed regions 412 slightly under cut the metal plates 410. The under cut regions 418 are such that the plates 410 slightly overhang the depressed regions 412. This is a common resulting formation due to the fact that the chemical etchant material eats away leadframe material in every direction, not only the downward direction needed to shape the depressed region 412.

Now, discussion is returned to the leadframe manufacturing process. After the leadframe 400 is processed to have multiple studs 412, as shown in FIG. 4E, the leadframe 400 may undergo a metal treatment process, such as CZ treatment. CZ treatment is a chemical etching process for leadframes or substrates that enhances adhesion between metal leadframes and various types of materials such as mold compounds and solder masks. Specifically, this treatment process will allow the studs 414 to be securely embedded within the plastic or epoxy material forming the molding panel.

Figure 5:
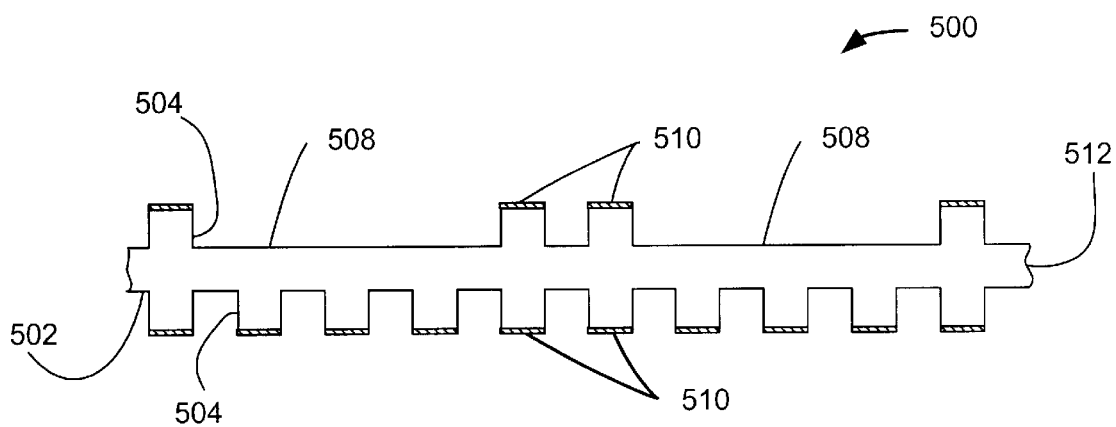
FIG. 5 illustrates a side plan view of one embodiment of a leadframe processed to the point described in FIG. 4E.

FIG. 5 now illustrates a side plan view of one embodiment of a leadframe processed to the point described in FIG. 4E. FIG. 5 illustrates a portion of leadframe 500 having a bottom surface 502 that has an array of studs 504. This portion of leadframe 500 has a top surface 506 having studs 504 that surround flat sections 508. Flat sections 508 are areas in which die attach pads and semiconductor dies can be placed; as such the flat sections 508 can be referred to as die attach recesses. The section of the leadframe forming the die attach recesses has a thickness that is less than the height of the studs 504. The thinness of the die attach recess 508 is advantageous in some situations as it ultimately allows the packaged semiconductor device to have a smaller overall thickness. Metal plates 510 are formed on the surface of each stud 504 and the studs are held in array formation by connection sheet 512.

Figure 6:
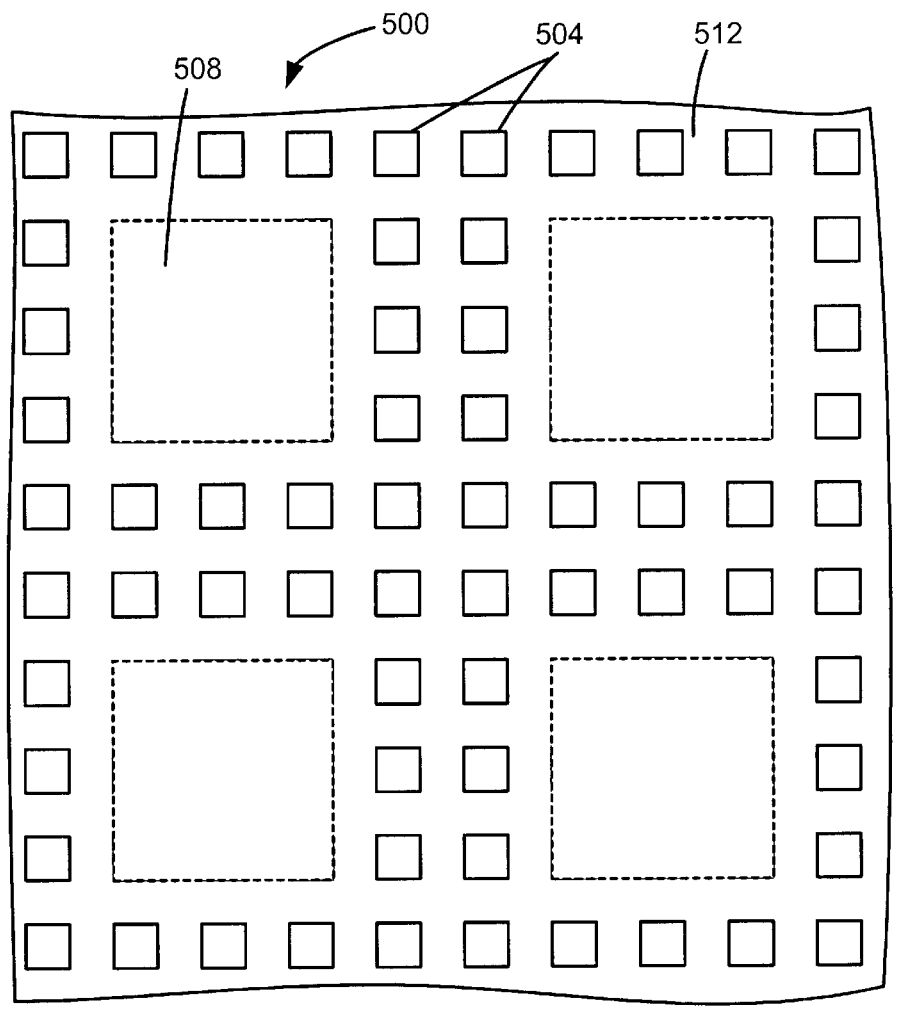
FIG. 6 illustrates a top plan view of the leadframe in FIG. 5.

FIG. 6 illustrates a top plan view of leadframe 500. From the top plan view, flat sections 508 and studs 504, with their corresponding plates 510, are seen to have square shaped outlines. In alternative embodiments, flat sections 508 and studs 504, with their corresponding plates 510, may have other various shapes such as circular. Also in this top view, it can be more clearly seen how connection sheet 512 surrounds and thereby supports the array of studs 504. With regards to singulation processes and processes for removing the connection sheet 512, square shaped studs 504 are conducive to processes utilizing saw blades or chemical etchants. Circular shaped studs 504, on the other hand, are conducive to chemical etchants.

Figure 7:
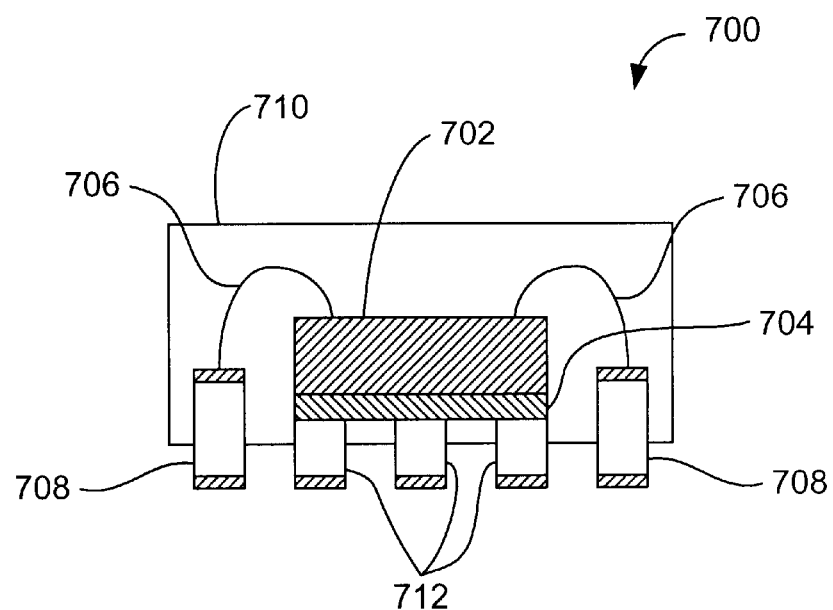
FIG. 7 illustrates a side plan view of a packaged semiconductor device formed from a studded leadframe, such as the leadframe of FIG. 5.

FIG. 7 illustrates a side plan view of a packaged semiconductor device 700 formed from a studded leadframe, such as leadframe 500 of FIG. 5. To obtain device 700, several other semiconductor device-manufacturing processes must be performed. For example, a semiconductor die 702 and die attach pad 704 are attached to the leadframe. Then interconnect wires 706 are wire bonded so to connect the semiconductor die 702 to the studs 708. It should be appreciated by those of skill in the art that at least the metal plates should be washed of the metal particulates that are remaining from the etching and/or the CZ treatments. Washing the metal plates is important because effective wire bonds are more likely to result when wires are bonded to clean surfaces. Molding material is then commonly flood molded to encapsulate the die 702, the interconnecting wires 706, and the top portions of the studs 708. The molding material is allowed to cure into a mold panel 710, which forms the main body of semiconductor device 700. Since the mold panel 710 secures the studs 708 in the array formation, the connection sheet is removed by either sawing or etching techniques. Removal of the connection sheet also serves to electrically isolate each of the studs 708 from each other, thereby allowing for electrical operation of the semiconductor device. The electrically operable devices can then be tested, singulated, and then shipped to customers. It should be appreciated that die attach pad 704 may be substituted with smaller and individual support elements that can support the die 702 on top of the studs 712. Each of the individual support elements, having a diameter approximate to that of the diameter of studs 712, would sit on top of each of the studs 712 and support the die 702.

In FIG. 7, it can be seen that studs 712 are underneath the die attach pad 704 and that they are not electrically connected to die 702. Molding material 710 underneath the die attach pad 704 and between the studs 712 assists in bonding the studs 712 to the bottom surface of the die attach pad 704. The bottom surface of package 700 has a full matrix array of contact studs 708 and 712; this can be referred to as a full land grid array package. In alternative embodiments, studs 712 can be replaced by a solid section of the leadframe that covers the same area occupied by the studs 712. However, it is advantageous to have individual studs underneath the die attach pad 704 because individual studs 704 can be attached to solder paste, for example, on a printed circuit board more easily than can a solid section of a leadframe. The individual studs 718 can be more easily attached to a printed circuit board because the footprint of each stud 718 is the same size as the footprint of studs 708. Since the studs 712 and 708 have the same footprint, they require approximately the same setting time when being set into the solder paste. The setting time is the time required for out-gassing from the solder paste to occur. This is important since incomplete out-gassing may leave voids in the solder paste. Voids in the solder paste can lead to improper bonding between the semiconductor device and a printed circuit board. In contrast, when the semiconductor device 700 has a solid section of leadframe in place of the studs 712, the solid section of leadframe requires a longer setting time since gases require a longer time period to travel along the bigger solid section of leadframe. Therefore, a solid section of leadframe necessitates long processing cycles and can cause the solder paste connecting the studs 708 and a solid piece of leadframe to out-gas to different qualities.

Figure 7A:
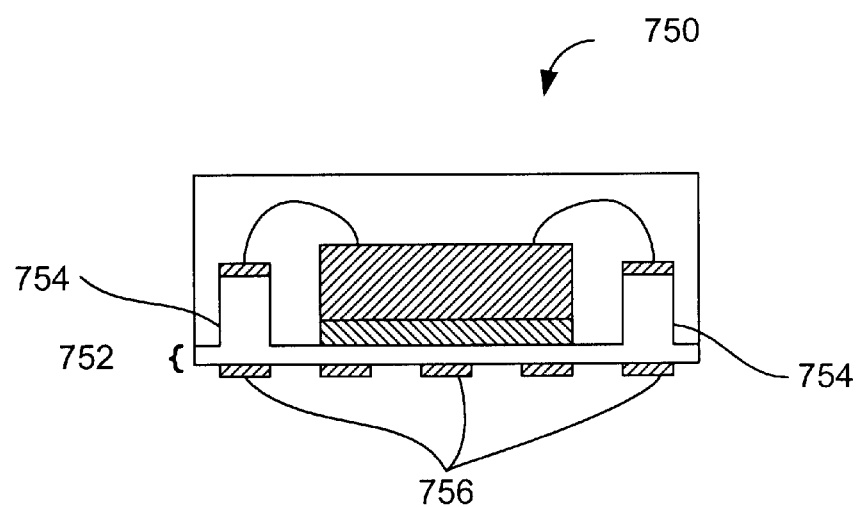
FIG. 7A illustrates a side plan view of a packaged semiconductor device wherein the studs are formed from the top surface of the leadframe substrate.

So far the process for manufacturing the semiconductor devices using a studded leadframe has been described wherein studs are formed from the direction of both the top and bottom surfaces of the leadframe. It is noted that in alternative processes, studs can also be formed from one of the surface directions; for example, from only the top or the bottom surface of the leadframe. FIG. 7A illustrates an example of such a semiconductor package 750 prior to the operation of removing the connection sheet 752. As can be seen, the studs 754 are formed from the top surface of the substrate and connection sheet 752 is formed on the bottom end of the studs 754. The connection sheet 752 may be removed through etching processes. In the embodiment of the package 750, etch resistant metal plates 756 protect the bottom surface of the connection sheet 752 from the etching process. A full land grid array will result after etching the package 750 in FIG. 7A. In alternative embodiments of package 750, metal plates 756 are not provided beneath the semiconductor die and the bottom surface of connection sheet 752 is completely covered by a layer of photo resist; this embodiment results in conductive posts 754 and a flat section of the connection sheet remaining under the die. The remaining steps to form the semiconductor device are similar to when both sides of the leadframe are etched to form studs.

FIG. 8 illustrates a side plan view of semiconductor device 800 wherein a flip chip semiconductor device 802 is attached to studs 804. The flip chip 802 is secured to the studs 804 through the solder paste balls 806 and because mold panel 808 encapsulates the flip chip 802 and the upper portions of the studs 804. Flip chips, as are commonly known, are semiconductor devices wherein the electrical contact pads are located on the surface of the semiconductor die. Flip chips commonly experience structural damage due to thermal cycle fatigue because of their small size and large difference in temperature coefficients of expansion with respect to printed circuit boards. By attaching flip chips onto studded leadframes to obtain devices such as device 800 in FIG. 8, flip chip devices can be strengthened with respect to resisting thermal cycle fatigue. Strength is added to the flip chip 802 because the studs 804 and mold pandel 808 serve as a buffer that absorbs the stress caused by thermal temperature expansion.

FIGS. 9A and 9B are now discussed with respect to an earlier mentioned aspect of the studded leadframes. It was earlier discussed that the metal plates 410 in FIGS. 4D and 4E overhang the depressed regions 412. This overhang, indicated by reference number 418 in FIG. 4E, is an undesirable configuration for at least the following reasons. Such overhang compromises the electrical connection between the studs 414, plates 410 and either a semiconductor die or a printed circuit board. Also, the structural integrity of the studs 414 are weakened since the surface area available for the connection between the studs 414 and the plates 410 is reduced. FIGS. 9A and 9B illustrate side plan views of a conductive leadframe in order to describe a technique for preventing plates 902 from hanging over depressed regions 904 in a leadframe. In FIG. 9A, plates 902 are formed on the top and bottom surfaces of leadframe 900. However, covering each of plates 902, are resist caps 906. Resist caps 906 function to cover a portion of the leadframe immediately surrounding each of the plates 902. Resist caps 906 serve to protect the respectively covered portions of the leadframe from the etching process that forms the depressed regions 904. Protecting the additional area of leadframe is a technique for countering the tendency of the chemical etching material to eat away metal that is underneath the plates 902. The resist caps 906 force the chemical etchants to eat away at metal starting at a location farther away from the plates 902. The chemical etchant eats away metal underneath the resist caps 906, but the etchant is prevented from eating away metal underneath the plates 902, as shown in FIG. 9B. At the appropriate time, the resist caps 906 can be removed by methods commonly known in the photolithography arts.

In alternative embodiments of resist caps 906, the caps do not entirely cover the plates 902. In this embodiment, the caps cover the portions of the leadframe immediately surround each plate 902 without completely covering the plates 902. For example, the caps would leave the top surface of the plates 902 exposed.

Figure 10:
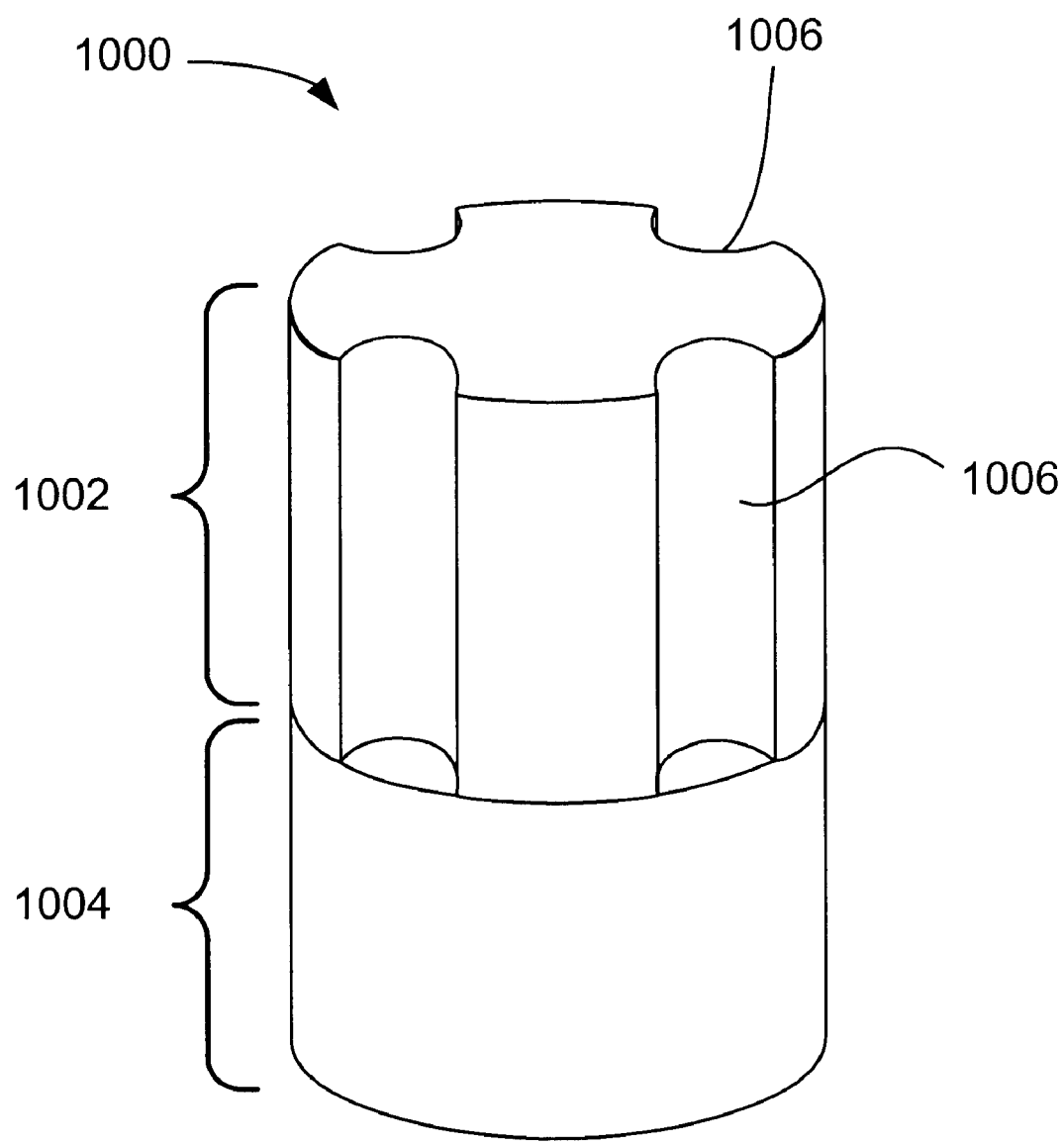
FIG. 10 illustrates a studs from a studded leadframe having locking grooves according to one embodiment of the present invention.

FIG. 10 illustrates one of the studs 1000 from a studded leadframe according to an alternative embodiment of the present invention. Stud 1000 includes a top portion 1002 and a bottom portion 1004. Bottom portion 1004 can be the portion of the stud that will be exposed through the mold panel and be connected to a electronic circuits that are, for example, within a printed circuit board. Top portion 1002 can be the portion of the stud that will be embedded within a mold panel of a semiconductor device. Top portion 1002 has indented grooves 1006 that provide a stronger bond between the stud 1000 and the mold panel. The "locking" grooves 1006 provide a contoured surface for a stronger bond to form between a mold panel and the stud 1000. It should be appreciated that locking grooves 1006 can have a variety of many shapes. For example, instead of having the semicircular or arcuate shape, the grooves 1006 can have a rectangular or triangular shape.

While this invention has been described in terms of several preferred embodiments, there are alteration, permutations, and equivalents which fall within the scope of this invention. It should also be noted that there are many alternative ways of implementing the methods and apparatuses of the present invention. It is therefore intended that the following appended claims be interpreted as including all such alterations, permutations, and equivalents as fall within the true spirit and scope of the present invention.

We claim:

1. A method for patterning a conductive substrate, which is utilized to form a packaged semiconductor device, the method comprising:

providing a conductive leadframe;

applying a photo resist layer to a surface of the conductive leadframe and patterning the photo resist layer to expose stud regions of the leadframe;

plating the exposed stud regions on the conductive leadframe with a metallic barrier layer over the stud regions;

plating the stud regions on the conductive leadframe with a second metallic material to form a second metallic layer over the barrier layer in the stud regions;

stripping the photo resist from the surface of the conductive leadframe; and etching the conductive leadframe areas surrounding the metallic barrier layers and second metallic layers to form depressed regions and a plurality of studs by using the metallic barrier layers and second metallic layers as an etching resist, whereby the depressed regions define the plurality of studs and each of the plurality of studs support the metallic barrier layers and second metallic layers, wherein at least some of the studs are formed with locking grooves that are configured to allow a molding material to securely adhere to the studs.

2. A method for patterning a conductive substrate as recited in claim 1 wherein the metallic barrier layer is formed of nickel and the second metallic material is gold.

3. A method for patterning a conductive substrate as recited in claim 1 further comprising:

treating the etched conductive leadframe with a CZ treatment.

4. A method for patterning a conductive substrate as recited in claim 1 wherein the conductive substrate has a top surface and a bottom surface, and wherein the etching also operates to form a die attach recess on the top surface of the conductive substrate.

5. A method for patterning a conductive substrate as recited in claim 1 further comprising:

attaching a semiconductor die to the etched conductive substrate;

wire bonding interconnecting wires to connect the semiconductor die and at least one of the plurality of studs; and molding a molding cap over the die, the interconnecting wires, and the etched conductive substrate.

6. A method for patterning a conductive substrate as recited in claim 5 wherein a chip scale package or a land grid array semiconductor device is formed.

7. A method for patterning a conductive substrate as recited in claim 1 further comprising:

attaching bond pads of a semiconductor die directly to the plurality of studs.

8. A method for patterning a conductive substrate, which is utilized to form a packaged semiconductor device, the method comprising:

providing a conductive leadframe;

applying photo resist layer to a surface of the conductive leadframe and patterning the photo resist layer to expose a plurality of stud regions of the leadframe;

plating the exposed stud regions on the conductive leadframe with nickel to form a nickel layer over the stud regions;

plating the stud regions on the conductive leadframe with gold to form a gold layer over the nickel layers in the stud regions;

stripping the photo resist from the surface of the conductive leadframe; and forming a plurality of etch resistant caps that cover a portion of the conductive leadframe immediately surrounding the perimeter of each of the nickel and gold layers; and etching the conductive leadframe areas surrounding each of the etch resistant caps to form depressed regions and a plurality of studs, whereby the depressed regions define the plurality of studs, wherein at least some of the studs are formed with locking grooves that are configured to allow a molding material to securely adhere to the studs.

9. A method for patterning a conductive substrate as recited in claim 8 wherein the etch resistant caps encapsulates each of the nickel and gold layers.

10. A method for patterning a conductive substrate, which is utilized to form a packaged semiconductor device, the method comprising:

providing a conductive leadframe;

applying a photo resist layer to a surface of the conductive leadframe and patterning the photo resist layer to expose regions of the conductive leadframe;

etching the exposed regions of the conductive leadframe to form depressed regions that define an array of suds in the conductive leadframe, wherein each of the studs have at least one locking groove that is configured to allow a molding material to securely adhere to the studs;

stripping the photo resist from the surface of the conductive leadframe; and treating the etched conductive leadframe and the studs with a CZ treatment wherein the CZ treatment gives the conductive leadframe and the studs a surface finish that more easily bonds to the molding material.

11. A method for patterning a conductive substrate as recited in claim 10 further comprising:

attaching a flip chip semiconductor die to the CZ treated conductive substrate.

12. A method for packaging integrated circuits, comprising the steps of:

patterning a conductive substrate formed from a conductive material to define a plurality of studs and a connecting sheet connecting the plurality of studs, at least some of the studs including at least one locking groove;

physically mounting a die on the patterned conductive substrate;

electrically connecting the die to at least one of the plurality of studs;

molding a molding cap over the die and the patterned conductive substrate, wherein the molding cap bonds to the surfaces of the studs and to the locking grooves; and removing the connecting sheet.

13. A method for packaging integrated circuits as recited in claim 12 wherein the studs with locking grooves have upper and lower portions and the locking grooves are formed in the upper portions of the studs.

14. A method for packaging integrated circuits as recited in claim 12 wherein the locking grooves have arcuate outlines.

15. A method for packaging integrated circuits as recited in claim 12 wherein the die is a flip chip die.

* * * * *